United States Patent [19]
Pazmino

[11] Patent Number: 5,910,783
[45] Date of Patent: Jun. 8, 1999

[54] PSEUDO BARREL SHIFTING FOR ENTROPY ENCODING

[75] Inventor: Edward Pazmino, Scottsdale, Ariz.

[73] Assignee: Intel Corporation, Santa Clara, Calif.

[21] Appl. No.: 08/867,557

[22] Filed: Jun. 2, 1997

[51] Int. Cl.[6] .................................................. H03M 7/00
[52] U.S. Cl. ............................................................ 341/60
[58] Field of Search ............................ 341/60; 364/260.7

[56] References Cited

U.S. PATENT DOCUMENTS 5,423,010  6/1995  Mizukami .................................. 341/60
5,446,916  8/1995  Derovanessian et al. ................. 341/60
5,627,991  5/1997  Hose, Jr. et al. ....................... 395/456

*Primary Examiner*—Howard L. Williams
*Attorney, Agent, or Firm*—Blakely, Sokoloff, Taylor & Zafman LLP

[57] ABSTRACT

A method, system, and apparatus for performing encoding employing a pseudo-barrel shifting technique. An encoder is provided with a buffer of at least twice a maximum symbol size. The encoder enables a window of bits in the buffer to be written during any time period. A steering circuit in the encoder steers valid data bits of an incoming symbol into appropriate enabled bit locations in the buffer. A read-out circuit in the encoder reads a data block of the maximum symbol size from the buffer after a write causes a boundary crossing in the buffer.

19 Claims, 6 Drawing Sheets

PSEUDO BARREL SHIFTING FOR ENTROPY ENCODING

BACKGROUND OF THE INVENTION (1) Field of the Invention

The invention relates to compression encoding. More specifically, the invention relates to achieving higher speed encodings with reduced hardware complexity.

(2) Related Art

In data transmission systems, data arrives as symbols of variable size. A symbol is a number of bits of valid data up to some maximum symbol size which is usually dictated by the hardware of the system. Typically, a maximum symbol size is the maximum number of bits that may be sent in one transaction. Typical values are 16 bits or 32 bits. If the symbols are not encoded, each symbol regardless of size is transferred as a packet to the recipient. Because transfers tend to be relatively slow, it is desirable to transfer as much data per transfer as possible. To this end, compression encoding techniques have been developed to pack symbols and portions of symbols together so as to yield a packet having a maximum symbol size of valid data at each transfer.

FIG. 1 illustrates this technique using prior art on a smaller scale in which the packet size has been assumed to be four bits. A pointer 101 is maintained to point to the first available location in a packing register 100 to which an incoming symbol may be written. FIG. 1 shows the packing register 100 during four cycles. During a cycle 105, no data has been written, and the register 100 is empty. In cycle 106, a 3-bit symbol, AAA, has been written to register 100, and pointer 101 now points to the 4th location in register 100. In a cycle 107, another 3-bit symbol, BBB, is written to the register 100. This results in the written data and the pointer 101 crossing a boundary 102. The data to the left of the boundary 102, "AAAB," represents a maximum symbol size, and a read of that data is initiated. In the next cycle 108, the data written beyond boundary 102 must be shifted to the other side of the boundary and a write of the single bit value, C, initiated. To accomplish this shifting and allow for the write during a single cycle 108, this, the simplified example, would require four 7-to-1 multiplexors and seven 4-to-1 multiplexors. In a more realistic example in which the maximum symbol size is 16 and a 31 bit register is employed, 16 15-to-1 multiplexors and 31 16-to-1 multiplexors would be required in order to do the shift and bit packing in one cycle.

In view of the foregoing, it is desirable to simplify the hardware without a loss of speed. Thus, for example, it is desirable to be able to read and write a symbol of up to a maximum size in every cycle.

BRIEF SUMMARY OF THE INVENTION

A method, system, and apparatus for performing encoding employing a pseudo-barrel shifting technique is disclosed. An encoder is provided with a buffer of at least twice a maximum symbol size. The encoder enables a window of bits in the buffer to be written during any time period. A steering circuit in the encoder steers valid data bits of an incoming symbol into appropriate enabled bit locations in the buffer. A read-out circuit in the encoder reads a data block of the maximum symbol size from the buffer after a write causes a boundary crossing in the buffer.

DETAILED DESCRIPTION OF THE INVENTION

In the following description, the invention will be described with a reference to a four-bit maximum size above a symbol is a number of valid data bits transmitted during a predetermined unit of time. However, one of ordinary skill in the art will recognize a more realistic maximum symbol size is 16 or 32 bits, and that the technique is readily expandable to those and other sizes from the disclosure contained herein.

Figure 1:
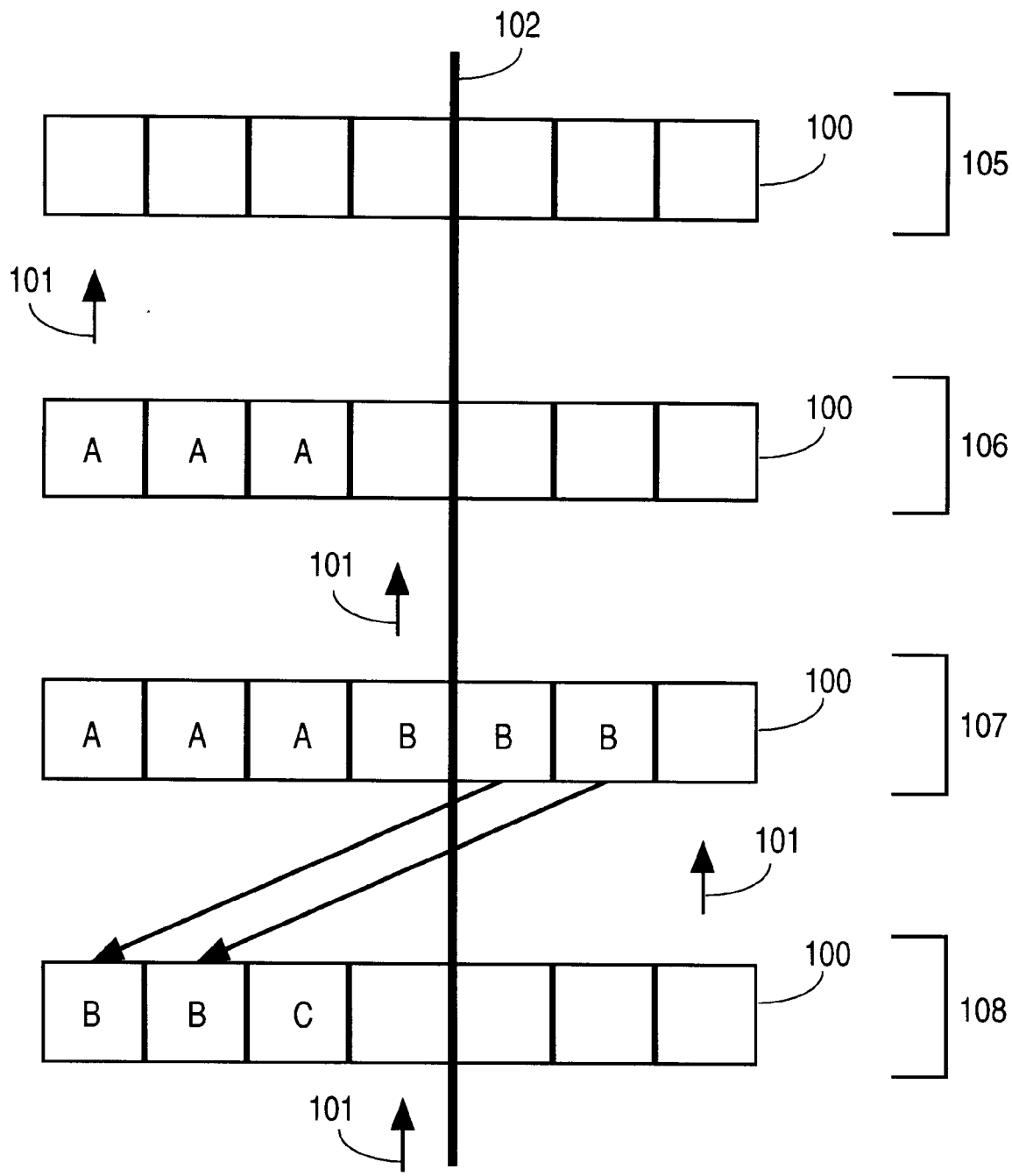
FIG. 1 is a diagram of a prior art barrel shifting technique.
Figure 2:
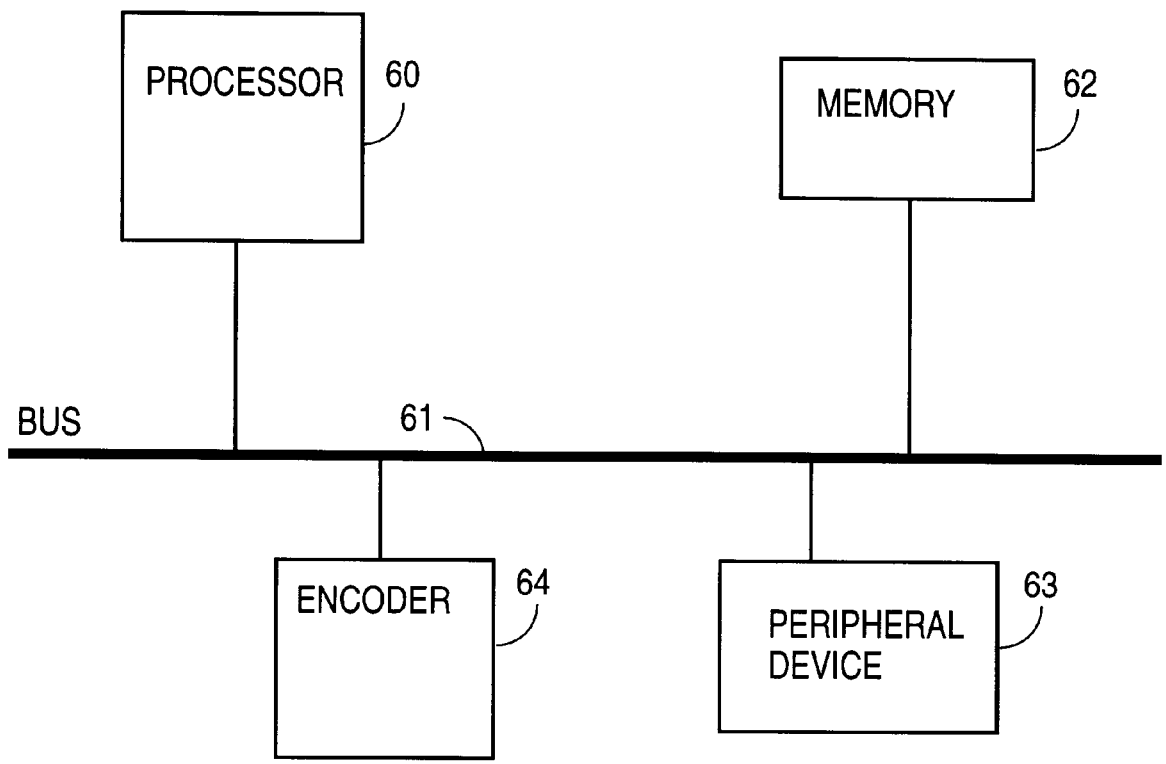
FIG. 2 is a block diagram of a system employing one embodiment of the invention.

FIG. 2 is a block diagram of a system employing one embodiment of the invention. The processor 60 is coupled to a bus 61. A memory 62 and a peripheral device 63 are also coupled to the bus. An encoder 64 of one embodiment of the instant invention is also coupled to bus 61. The encoder 64 receives data on the bus in the form of variable size symbols up to a maximum symbol size from one of the other devices 60, 62, 63 on the bus 61. The encoder 64 also receives an indication of the actual symbol size which is used to adjust the index as described below. The encoder performs compression and returns symbols of the maximum symbol size to a target device. For example, the target device might be memory 62 wherein symbols from the processor are encoded so as to conserve memory space. In another example, data from the processor might be encoded to be transferred out over a limited bandwidth transmission line, thus, leading to more efficient transmission. Such compression is particularly useful in certain video and multimedia applications. The details of the encoder are described in greater detail below.

Figure 3:
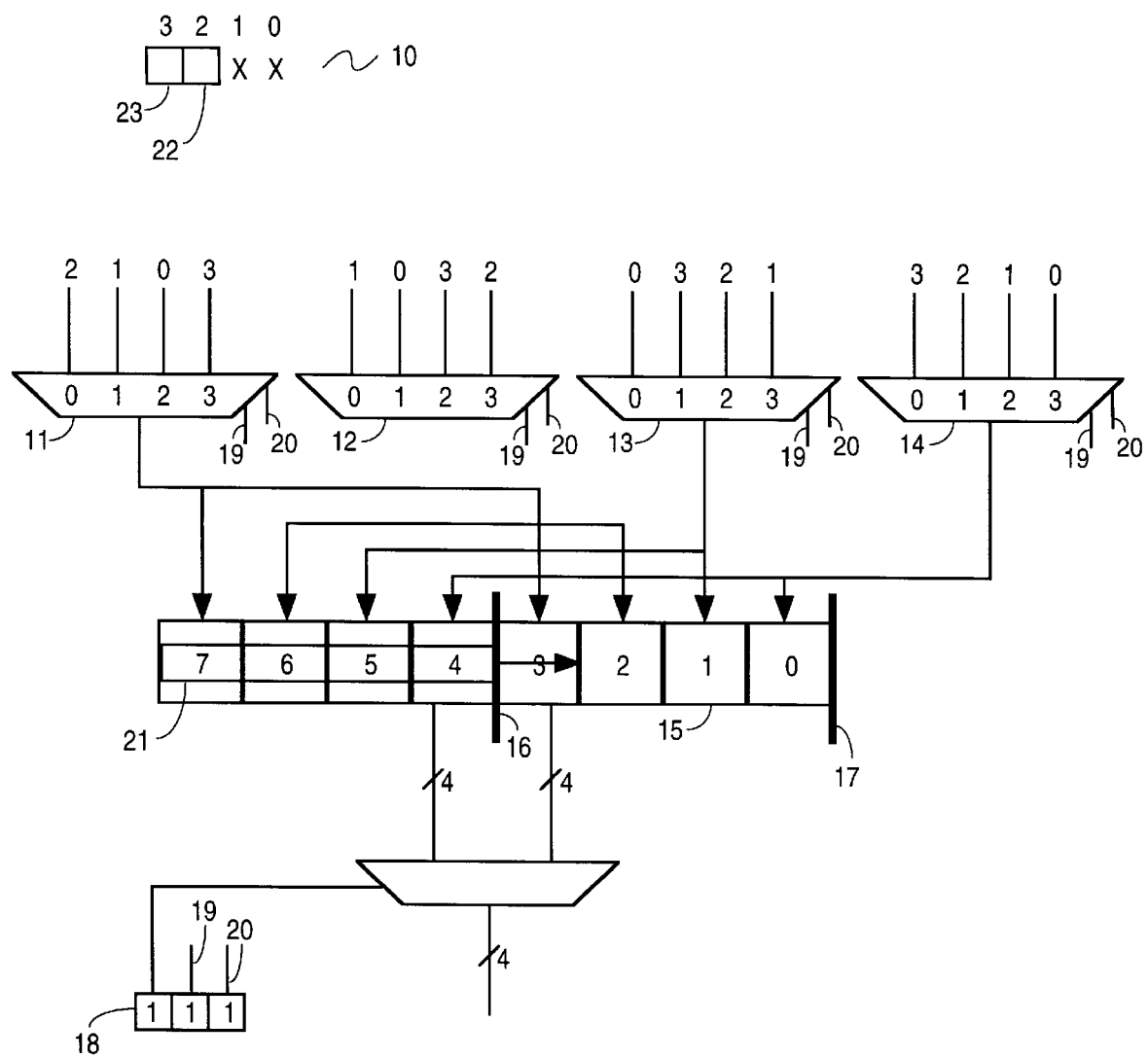
FIG. 3 shows a simplified block diagram of one embodiment of the invention.

FIG. 3 shows a simplified block diagram of one embodiment of the invention. A symbol 10 of an arbitrary size (in this case, two bits) up to a maximum size (in this case, four bits) is steered by a steering circuit (described below) into a buffer 15. Buffer 15 is selected to be of a size some integer multiple of the maximum symbol size, but not less than twice the maximum symbol size. Here, buffer 15 has bit storage locations 7 through 0. Boundaries 16, 17 exist at maximum symbol size increments within the buffer. An index 18 is maintained to identify the first available bit storage location within buffer 15. An enabling window 21 enables the bit storage locations within buffer 15 contained within the window to be written.

In one embodiment, enabling windows 21 is always the maximum symbol size and begins at the first available bit storage location as indicated by the index. In another embodiment, enabling window 21 begins at the first available bit storage location, but is only as large as the actual incoming symbol 10. Because the size is used in adjusting the index, this second embodiment of the enabling window 21 does not require any additional information be passed to the encoder than in the first embodiment. Conversely, other than possible power saving, by reducing the number of enabled bits, there is no particular benefit to not enabling a maximum symbol size because the next write will begin at a bit the previous symbol size less than the previous write. For example, if the index is seven and a symbol of size two is incoming, even if four bits are written, i.e., last two bits invalid, the index is decremented by two to be five. Thus, the invalid data will be overwritten on the next write cycle. In FIG. 3, the foregoing example is shown. Incoming symbol 10 only contains two bits of valid data 22 and 23, e.g., symbol 10 is less than the maximum symbol size.

In one embodiment, the steering circuit includes a number of multiplexors 11–14 equal to the maximum symbol size, each multiplexor 11–14 accepting the maximum symbol size as the number of inputs (maximum symbol size:1 multiplexors). Thus, multiplexors 11 through 14 are all 4:1 multiplexors. The select lines for the multiplexors are provided by the low order bits of the index. Assuming the buffer length is exactly twice the maximum symbol size, all bits except the most significant bit of the index provide the select lines. Data flows into buffer 15 in a left to right manner. Thus, when symbol 10 is applied to the inputs of multiplexors 11 through 14 as shown, enabling window 21 permits valid data bit 23 to be written into bit location 7 and valid data bit 22 to be written into bit storage location 6. The relevant data or don't cares symbolized by the XX of symbol 10 may or may not be written into bit locations 5 and 4 depending on which embodiment of enabling window is employed.

Responsive to the write of valid data bits 23 and 22 to bit storage locations 7 and 6, respectively, the index 18 is decremented by the symbol size (here, two) to yield a new index 101 which will result in the corresponding move of the enabling window such that in a next cycle, bit storage locations 5 through 2 will be enabled.

Figure 4:
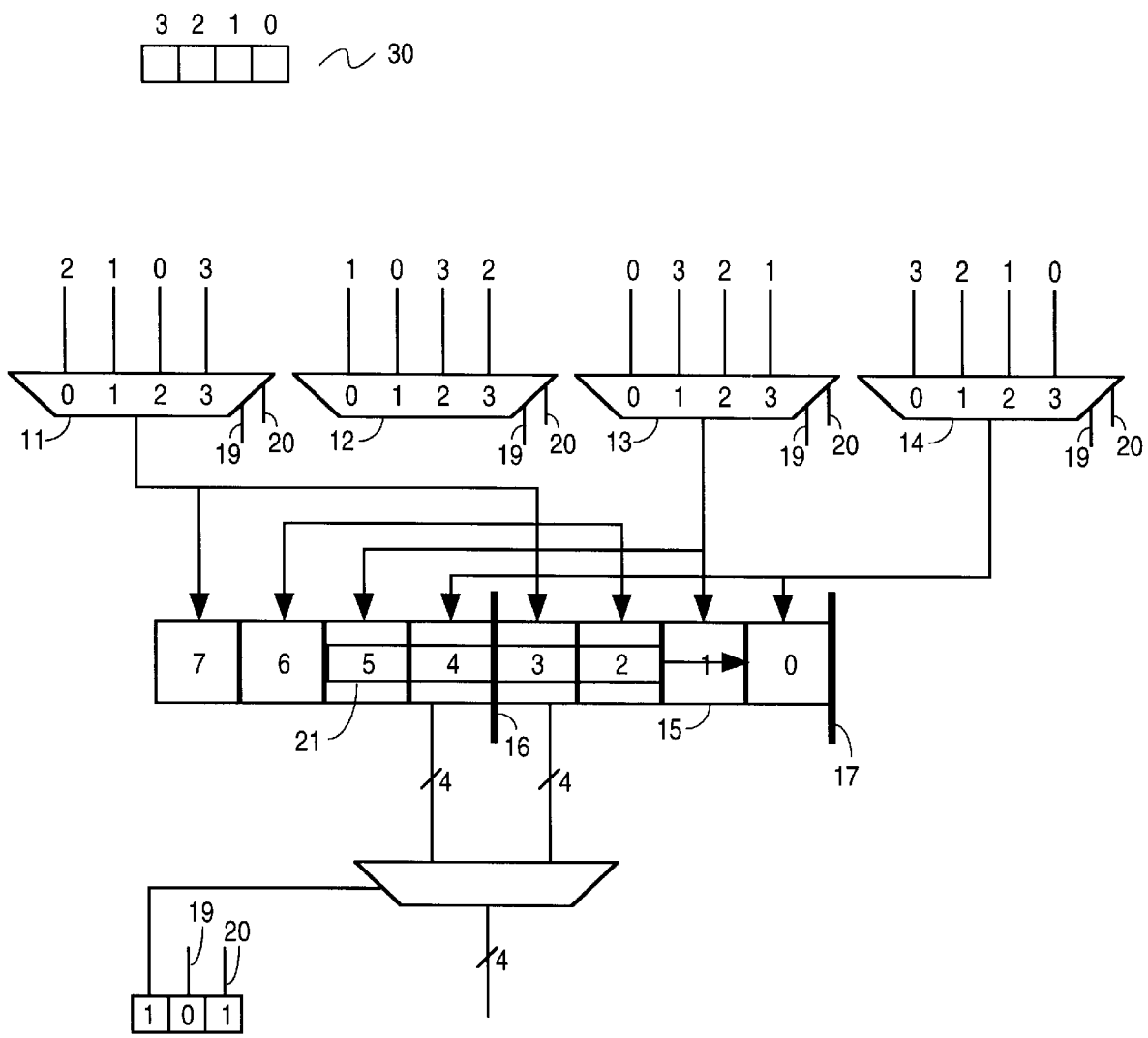
FIG. 4 shows an exemplary next cycle after the transaction described with reference to FIG. 3.

FIG. 4 shows an exemplary next cycle after the transaction described with reference to FIG. 3. In this cycle, a symbol 30 of maximum symbol size, e.g., here, four, is applied to the inputs of multiplexors 11–14 with the index providing selection lines 19 and 20. Enabling window 21 enables bits 5, 4, 3, and 2 to be written in buffer 15. Thus, the invalid data XX in bits 5 and 4 are overwritten by the first two bits of incoming symbol 30. This write causes the crossing of boundary 16. However, because no boundary crossing had occurred before the write, no data is read from buffer 15 in this cycle.

Figure 5:
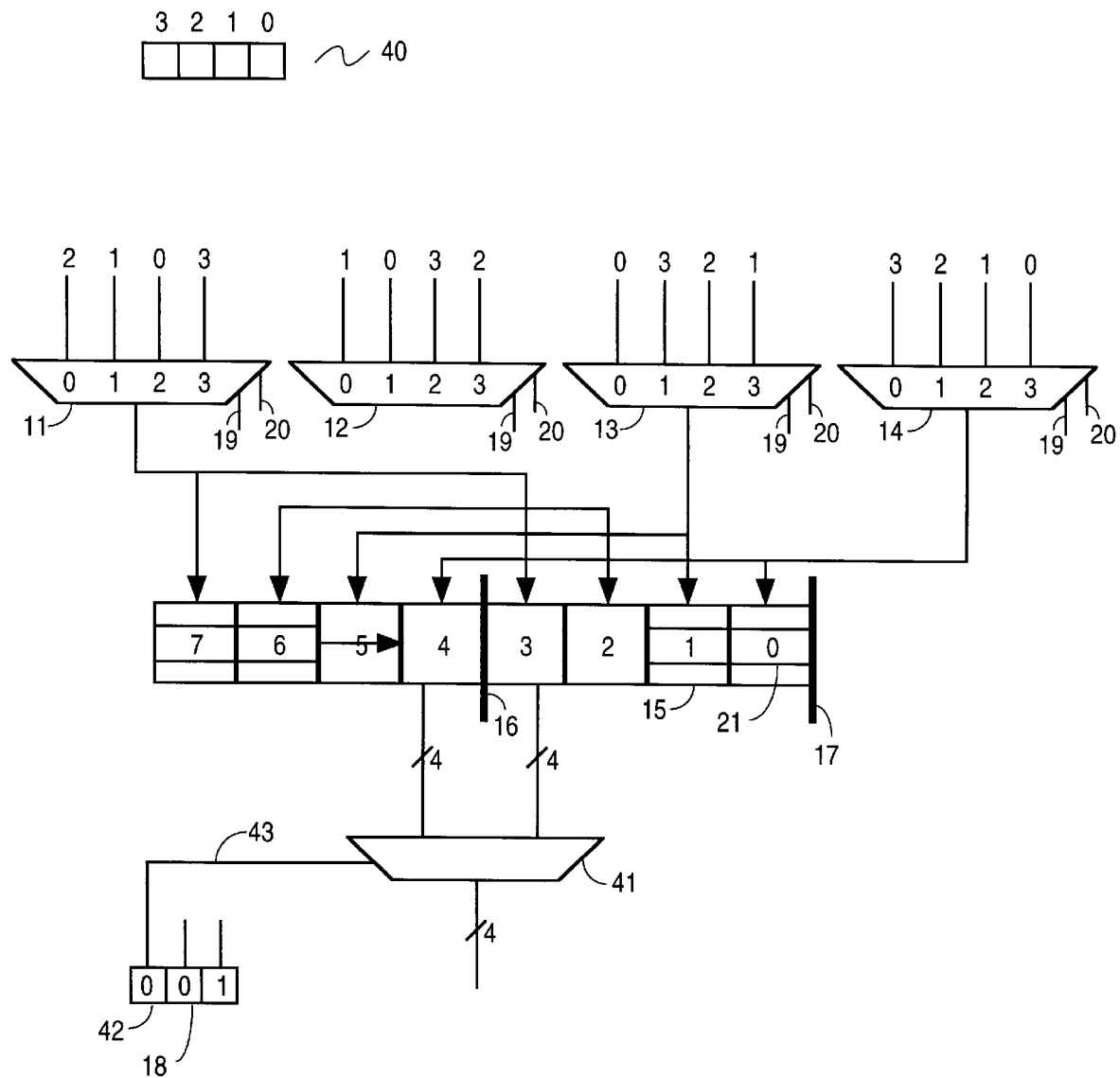
FIG. 5 shows an exemplary third cycle after the transaction described with reference to FIG. 3.

FIG. 5 shows an exemplary third cycle after the transaction described with reference to FIG. 3. In this cycle, another symbol of maximum size 40 is fed into multiplexors 11–14. Enabling window 21 enables bits 1, 0, and wraps around to enable bits 7 and 6. Index 18 identifies the first writable bit, i.e., in this case, bit 1. However, because boundary 16 was crossed in the previous cycle, the original data and bits 7 through 4 should be read out before being overwritten by a portion of incoming symbol 40. The read-out circuit 41 comprises four 2:1 multiplexors with inputs coming from corresponding locations within each maximum symbol size of data in the buffer, e.g., a multiplexor will have bits 7 and 3 as inputs and the bits 6 and 2, etc. The read-out multiplexors have select line 43 provided by the most significant bit (MSb) 42 of the index 18. The select signal is connected to select the maximum symbol size on the opposite side of just crossed boundary 16 from the current index. The read-out is enabled responsive to a toggle of MSb 42. Thus, the read occurs, and the data is latched down to a temporary storage (not shown) in route to its ultimate target. The temporary storage could be any type of memory element including, without limitation, registers and FIFOs. The incoming data is latched into the enabled bits of buffer 15 in the same cycle and even on the same rising edge. However, no overwrite occurs because the read data is effectively shifting out concurrently with the written data latching in. The operation is analogous to the operation of a shift register.

In an alternate embodiment in which the buffer length was greater than twice the maximum symbol size, the read-out circuit 41 would require, e.g., four 3:1 muxes for three times the symbol size, four 4:1 muxes for four times the symbol size, etc. Moreover, the index would necessarily be a larger number of bits, for example, it would be four bits for a buffer three or four times the maximum symbol size. In either case, the two high order bits would be required for selection, but toggling of the second most significant bit would in that example indicate a boundary crossing.

Figure 6:
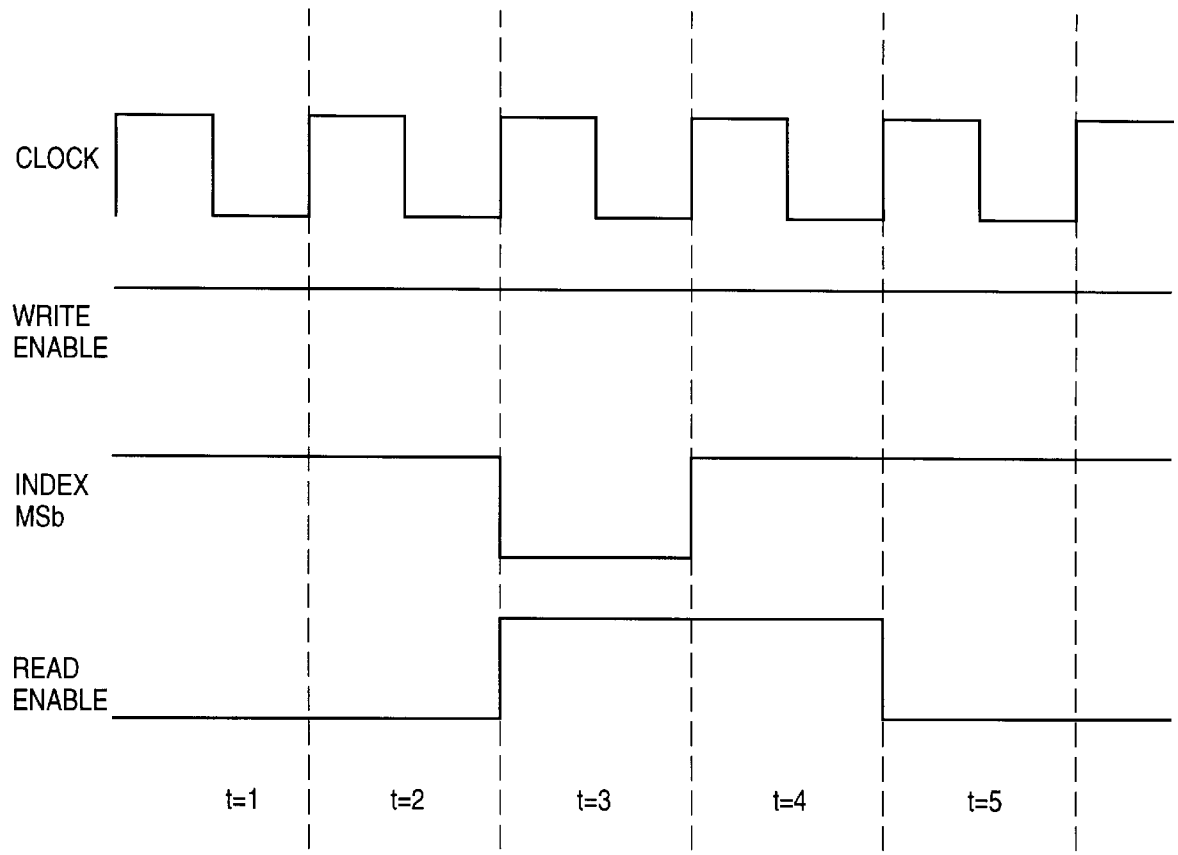
FIG. 6 is a timing diagram showing for one embodiment of the invention.

FIG. 6 is a timing diagram showing the clock signal, the write enable signal, the index most significant bit and a read enable signal during five exemplary cycles t=1–t=5. In this example timing diagram, the signals are presumed active high, though active low signals are within the scope and contemplation of the invention. Moreover, the write enable signal is shown always active. This need not be the case, for example, in the event that no data, e.g., a symbol size of zero, is presented to the encoder. The write enable need not be asserted. In this diagram, time t=1–3 correspond to cycles of FIGS. 3–5. In cycle t=4 and t=5, no new symbol is presented to the encoder. As discussed above, in a second time frame, the boundary crossing occurs resulting in the MSb of the index toggling from one to zero. Responsive to this toggle, the read enable is asserted and the most significant maximum symbol size of the buffer is read out in the cycle following the boundary crossing, i.e., t=3. In t=3, boundary crossing occurs again, resulting in the toggling of the index's MSb from zero to one. As a result of this toggle, the read remains asserted for t=4, and the least significant maximum symbol size is read from the buffer. Because there is no toggle of the index's most significant bit in cycle t=4, t=5, the read enable is deasserted after t=4 and remains deasserted until the next toggle of the index's MSb.

In an embodiment having a maximum symbol size of sixteen bits, the steering circuit would use sixteen 16:1 muxes, and the read out circuit would require sixteen 2:1 muxes (assuming a buffer of two times the maximum symbol size). This is compared with thirty-one 16:1 muxes for the 31 bits and sixteen 15:1 muxes to perform the required shifting of the prior art. Accordingly, the described invention reduces hardware complexity while providing equal or greater speed to prior art encoding. It is observed that the same functionality can be performed with software, though at greatly reduced speed. Nevertheless, such is deemed within the scope and contemplation of the invention.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

I claim:

1. An encoder comprising:

a buffer of a size at least twice a maximum symbol size;

an enabling window which enables a number of bit locations of the buffer at least equal to a symbol size;

a plurality of steering circuits which steer bits of an incoming symbol into enabled bit locations in the buffer; and a read out circuit which reads data of the maximum symbol size from the buffer responsive to a boundary crossing.

2. The encoder of claim 1 wherein the steering circuits comprise a maximum symbol multiplexor.

3. The encoder of claim 2 further comprising:

a boundary crossing identifier; and an index generator which generates a pointer to a first free bit in the buffer.

4. The encoder of claim 3 wherein a boundary crossing is indicated by a change in a most significant bit of an index between a first transaction and a second transaction.

5. The encoder of claim 2 wherein a plurality of select lines to the multiplexor are driven by bits of an index less than a most significant bit.

6. The encoder of claim 2 wherein the maximum symbol size is one of 8 bits, 16 bits, and 32 bits.

7. The encoder of claim 1 wherein the enabling window enables writing to a number of bits equal to the maximum symbol size.

8. A method of encoding data comprising the steps of:

receiving a symbol of a symbol size up to a maximum symbol size;

maintaining an index pointing to a first available bit location in a buffer of at least twice the maximum symbol size;

writing the symbol to the enabled bits beginning at the first available location;

enabling a number of bits equal to at least the symbol size to be written beginning with the first available location;

adjusting the index by the size of the symbol; and initiating a read of a portion buffer if a change in the index indicates a boundary crossing.

9. The method of claim 8 wherein the step of writing comprises the steps of:

providing a selection signal to a steering mechanism; and steering the symbol into enabled bit locations responsive to the selection signal.

10. The method of claim 9 wherein the selection signal is derived from all but a most significant bit of the index.

11. The method of claim 8 wherein the step of initiating comprises the step of:

responding to a toggle of a most significant bit of the index; and reading a most significant maximum symbol size if the most significant bit of the index toggles to 0; and reading a least significant maximum symbol size if the most significant bit of the index toggles to 1.

12. A system comprising:

a bus;

a processor coupled to the bus;

a memory coupled to the bus; and an encoder coupled to the bus, the encoder including a steering circuit, a buffer of at least twice a maximum symbol size coupled to the steering circuit, and a read selecting circuit which selects a maximum symbol size of data to read from the buffer responsive to a boundary crossing signal.

13. The system of claim 12 wherein the steering circuits comprise a maximum symbol multiplexor.

14. The system of claim 13 wherein the encoder further comprises:

a boundary crossing identifier; and an index generator which generates a pointer to a first free bit in the buffer.

15. The system of claim 14 wherein a boundary crossing is indicated by a change in a most significant bit of an index between a first transaction and a second transaction.

16. The system of claim 14 wherein the encoder further comprises an enabling window enabling a number of bits to a maximum symbol size beginning at a bit identified by the pointer.

17. The system of claim 13 wherein a plurality of select lines to the multiplexor are driven by bits of an index less than a most significant bit.

18. The system of 13 wherein the maximum symbol size is one of 8 bits, 16 bits, and 32 bits.

19. The system of claim 12 wherein the enabling window enables writing to a number of bits equal to the maximum symbol size.

* * * * *